United States Patent
Moriya et al.

(10) Patent No.: US 8,698,113 B2
(45) Date of Patent: Apr. 15, 2014

(54) CHAMBER APPARATUS AND EXTREME ULTRAVIOLET (EUV) LIGHT GENERATION APPARATUS INCLUDING THE CHAMBER APPARATUS

(75) Inventors: Masato Moriya, Oyama (JP); Osamu Wakabayashi, Hiratsuka (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 13/696,517

(22) PCT Filed: Dec. 13, 2011

(86) PCT No.: PCT/IB2011/003027
§ 371 (c)(1),
(2), (4) Date: Nov. 6, 2012

(87) PCT Pub. No.: WO2012/104669
PCT Pub. Date: Aug. 9, 2012

(65) Prior Publication Data
US 2013/0048886 A1  Feb. 28, 2013

(30) Foreign Application Priority Data
Jan. 31, 2011  (JP) .................................. 2011-019024

(51) Int. Cl.
*H05G 2/00*  (2006.01)
(52) U.S. Cl.
USPC .................................... 250/504 R; 250/503.1
(58) Field of Classification Search
USPC ................. 250/493.1, 503.1, 504 R
See application file for complete search history.

(56) References Cited

U.S. PATENT DOCUMENTS

| 5,256,886 | A | 10/1993 | Wolf et al. | |
|---|---|---|---|---|
| 7,598,509 | B2 | 10/2009 | Ershov et al. | |
| 2005/0121428 | A1* | 6/2005 | Risser et al. | 219/121.73 |
| 2005/0286054 | A1 | 12/2005 | Chen et al. | |
| 2006/0102603 | A1* | 5/2006 | Zeller et al. | 219/121.74 |
| 2008/0233719 | A1 | 9/2008 | Omata | |
| 2010/0051832 | A1* | 3/2010 | Nishisaka et al. | 250/504 R |
| 2010/0078577 | A1* | 4/2010 | Moriya et al. | 250/504 R |
| 2010/0117009 | A1 | 5/2010 | Moriya et al. | |
| 2010/0171049 | A1* | 7/2010 | Moriya et al. | 250/504 R |
| 2010/0193710 | A1* | 8/2010 | Wakabayashi et al. | 250/504 R |
| 2010/0327192 | A1 | 12/2010 | Fomenkov et al. | |
| 2011/0220816 | A1 | 9/2011 | Kakizaki et al. | |

FOREIGN PATENT DOCUMENTS

WO  WO-2010/117861 A1  10/2010
WO  WO 2010117861 A1 *  10/2010

OTHER PUBLICATIONS

International Search Report mailed May 9, 2012 issued in corresponding International Application No. PCT/IB2011/003027.

* cited by examiner

*Primary Examiner* — Robert Kim
*Assistant Examiner* — David E Smith
(74) *Attorney, Agent, or Firm* — McDermott Will & Emery LLP

(57) ABSTRACT

A chamber apparatus used with a laser apparatus may include a chamber, a beam expanding optical system, and a focusing optical system. The chamber may be provided with at least one inlet, through which a laser beam outputted from the laser apparatus is introduced into the chamber. The beam expanding optical system is configured to expand the laser beam in diameter. The focusing optical system is configured to focus the laser beam that has been expanded in diameter.

4 Claims, 10 Drawing Sheets

CHAMBER APPARATUS AND EXTREME ULTRAVIOLET (EUV) LIGHT GENERATION APPARATUS INCLUDING THE CHAMBER APPARATUS

CROSS-REFERENCE TO RELATED APPLICATIONS

The present application is the U.S. National Phase under 35 U.S.C. §371 of International Application No. PCT/IB2011/003027, filed on Dec. 13, 2011, which in turn claims priority from Japanese Patent Application No. 2011-019024 filed Jan. 31, 2011.

BACKGROUND

1. Technical Field

This disclosure relates to a chamber apparatus and an extreme ultraviolet (EUV) light generation apparatus including the chamber apparatus.

2. Related Art

In recent years, semiconductor production processes have become capable of producing semiconductor devices with increasingly fine feature sizes, as photolithography has been making rapid progress toward finer fabrication. In the next generation of semiconductor production processes, microfabrication with feature sizes of 60 nm to 45 nm, and microfabrication with feature sizes of 32 nm or less, will be required. In order to meet the demand for microfabrication with feature sizes of 32 nm or less, for example, an exposure apparatus is needed in which an apparatus for generating EUV light at a wavelength of approximately 13 nm is combined with a reduced projection reflective optical system.

Three kinds of apparatuses for generating EUV light have been known in general, which include a LPP (Laser Produced Plasma) type apparatus in which plasma is generated by irradiating a target material with a laser beam, a DPP (Discharge Produced Plasma) type apparatus in which plasma is generated by electric discharge, and a SR (Synchrotron Radiation) type apparatus in which orbital radiation is used.

SUMMARY

A chamber apparatus according to one aspect of this disclosure may be used with a laser apparatus and may include a chamber, a beam expanding optical system, and a focusing optical system. The chamber may be provided with at least one inlet, through which a laser beam outputted from the laser apparatus can be introduced into the chamber. The beam expanding optical system is configured to expand the laser beam in diameter. The focusing optical system is configured to focus the laser beam that has been expanded in diameter.

An extreme ultraviolet (EUV) light generation apparatus according to another aspect of this disclosure may include the above chamber apparatus.

DESCRIPTION OF PREFERRED EMBODIMENTS

Figure 1:
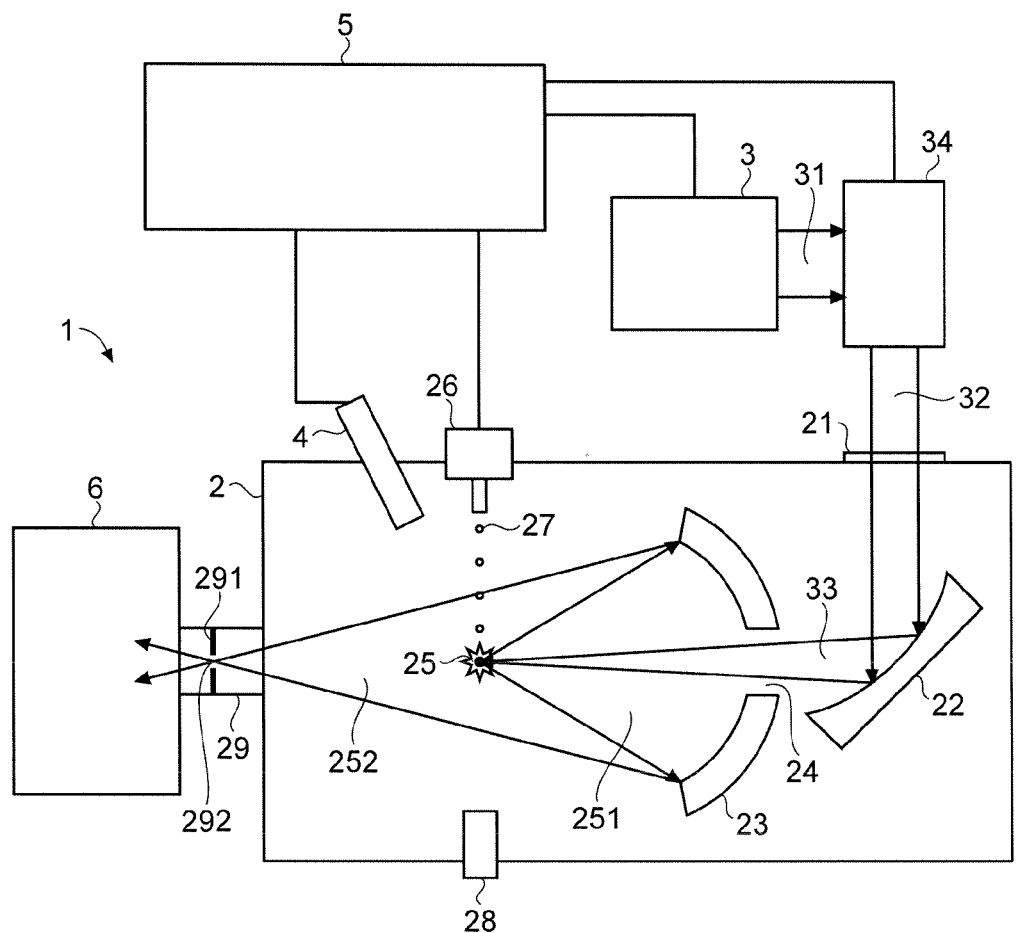
FIG. 1 schematically illustrates the configuration of an exemplary LPP type EUV light generation system.

Hereinafter, selected embodiments of this disclosure will be described in detail with reference to the accompanying drawings. The embodiments to be described below are merely illustrative in nature and do not limit the scope of this disclosure. Further, configurations and operations described in each embodiment are not all essential in implementing this disclosure. It should be noted that like elements are referenced by like reference symbols and numerals, and duplicate descriptions thereof will be omitted herein.

Hereinafter, a laser apparatus and an EUV light generation apparatus used with the laser apparatus will be described in detail with reference to the drawings. The embodiments of this disclosure will be illustrated following the table of contents below.

Contents
1. Summary
2. Terms
3. EUV Light Generation Apparatus
   3.1 Configuration
   3.2 Operation
4. EUV Light Generation Apparatus Including Beam Expanding Optical System and Focusing Optical System
   4.1 Configuration
   4.2 Operation
   4.3 Problems
5. Embodiment in which a First Mirror for Expanding a Laser Beam and a Second Mirror for Focusing the Laser Beam Are Combined
   5.1 Configuration
   5.2 Operation
   5.3 Effect
6. Embodiment of EUV Light Generation Chamber Including First and Second Mirrors
   6.1 Configuration
   6.2 Operation
   6.3 Effect
7. Optical System for Making Incident Axis and Focusing Axis of Laser Beam Coincide with Each Other
   7.1 Configuration
   7.2 Operation
   7.3 Effect 8. Embodiment of EUV Light Generation Apparatus Including Optical System for Making Incident Axis and Focusing Axis of Laser Beam Coincide with Each Other
  8.1 Configuration
  8.2 Operation
  8.3 Effect
9. Combination with Mirror Equipped with Tilt Mechanism
  9.1 Configuration
  9.2 Operation
  9.3 Effect
10. Supplementary Description
  10.1 Tilt Mechanism
  10.2 Focus Position Adjusting Mechanism
  10.3 Modification of Focus Position Adjusting Mechanism 1. Summary A focusing optical system for a laser beam in an LPP type EUV light generation apparatus may be required to focus a laser beam with high numerical apertures (NA), in order to improve its focusing performance. Thus, it may be contemplated that a laser beam is expanded in diameter and the laser beam, which has been expanded in diameter, is focused on a target by a focusing mirror.

In this case, however, a predetermined space will be required for disposing a beam expanding optical system for expanding a laser beam in diameter and a focusing optical system for focusing the laser beam. When the laser beam is expanded in diameter, the optical path in the beam expanding optical system and in the focusing optical system may be increased, resulting in the overall system increasing in size. As a result, the stability and the controllability of the focused laser beam may be deteriorated in some cases.

2. Terms

Terms used in this application may be interpreted as follows. The term "droplet" can refer to one or more liquid droplet(s) of a molten target material. Accordingly, the shape of the droplet is generally substantially spherical due to the surface tension at the surface of the droplet. The term "plasma generation region" can refer to a three-dimensional space in which plasma is generated.

3. Overview of EUV Light Generation System 3.1 Configuration

FIG. 1 schematically illustrates a configuration of an exemplary LPP type EUV light generation system. An EUV light generation apparatus 1 may be used with at least one laser apparatus 3. In this application, a system including the EUV light generation apparatus 1 and the laser apparatus 3 may be referred to as an EUV light generation system. As illustrated in FIG. 1 and described in detail below, the EUV light generation apparatus 1 may include a chamber 2. The chamber 2 may be airtightly sealed. The EUV light generation apparatus 1 may further include a target supply unit (droplet generator 26, for example). The target supply unit may be mounted to the chamber 2 so as to pass through a wall thereof, for example. A target material to be supplied by the target supply unit may include, but is not limited to, tin, terbium, gadolinium, lithium, xenon, or any combination thereof.

The chamber 2 may be provided with at least one through-hole (or inlet) in the wall thereof. The through-hole may be covered with a window 21, and a pulsed laser beam 32 may pass through the window 21. An EUV collector mirror 23 having a spheroidal reflective surface may be disposed inside the chamber 2, for example. The EUV collector mirror 23 may have first and second foci. The EUV collector mirror 23 may have a multi-layered reflective film formed on a surface thereof, the reflective film being formed of molybdenum and silicon being laminated alternately, for example. The EUV collector mirror 23 may preferably be disposed such that the first focus thereof lies in a plasma generation region 25 and the second focus thereof lies in an intermediate focus (IF) 292 defined by the specification of an exposure apparatus. The EUV collector mirror 23 may be provided with a through-hole 24 formed at the center thereof, and a pulsed laser beam 33 may travel through the through-hole 24.

Referring again to FIG. 1, the EUV light generation system 11 may include an EUV light generation control unit 5. Further, the EUV light generation apparatus 1 may include a target sensor 4. The target sensor 4 may be equipped with an imaging function and may detect at least one of a presence of, a trajectory of, and a position of a target.

Further, the EUV light generation apparatus 1 may include a connection 29 for allowing the interior of the chamber 2 to be in communication with the interior of the exposure apparatus 6. A wall 291 provided with an aperture may be disposed inside the connection 29. The wall 291 may be disposed such that the second focus of the EUV collector mirror 23 lies in the aperture formed therein.

Further, the EUV light generation system may include a laser beam travel direction control actuator 34, a laser beam focusing mirror 22, and a target collection unit 28 for collecting a target 27. The laser beam travel direction control actuator 34 may include an optical element for defining the direction in which the laser beam travels and an actuator for adjusting the position and the posture (or orientation) of the optical element.

3.2 Operation

With reference to FIG. 1, a pulsed laser beam 31 outputted from the laser apparatus 3 may travel through the window 21 via the laser beam travel direction control actuator 34, as a pulsed laser beam 32, and enter the chamber 2. The pulsed laser beam 32 may travel into the chamber 2 along at least one beam path from the laser apparatus 3, be reflected by the laser beam focusing mirror 22, and strike at least one target 27, as a pulsed laser beam 33.

The droplet generator 26 may output the targets 27 toward the plasma generation region 25 inside the chamber 2. The target 27 may be irradiated by at least one pulse included in the pulsed laser beam 33. The target 27, having been irradiated by the pulsed laser beam 33, may be turned into plasma, and rays of light including EUV light 251 may be emitted from the plasma. The EUV light 251 may be collected and reflected by the EUV collector mirror 23. EUV light 252 collected by the EUV collector mirror 23 may travel through the intermediate focus 292 and be outputted to the exposure apparatus 6. The target 27 may be irradiated by multiple pulses included in the pulsed laser beam 33. In cases in which the target 27 is irradiated by a plurality of pulsed laser beams, wavelengths of the plurality of pulsed laser beams may differ from one another, and the plurality of pulsed laser beams may strike the target 27 with different timing. Further, in such cases, the laser beam focusing mirror 22 may or may not be shared by the plurality of pulsed laser beams.

The EUV light generation control unit 5 may integrally control the overall operation of the EUV light generation system. The EUV light generation control unit 5 may process image data of the target 27 captured by the target sensor 4. Further, the EUV light generation control unit 5 may control at least one of a timing at which the target 27 is outputted and a direction into which the target 27 is outputted, for example. Furthermore, the EUV light generation control unit 5 may control at least one of a timing at which the laser apparatus 3 oscillates, a direction in which the pulsed laser beam 31 travels, and a position at which the pulsed laser beam 33 is focused, for example. The various controls mentioned above are merely examples, and other controls may be added as necessary.

4. EUV Light Generation Apparatus Including Beam Expanding Optical System and Focusing Optical System An EUV light generation apparatus including a beam expanding optical system and a focusing optical system will be described below with reference to the drawings.

4.1 Configuration

Figure 2:
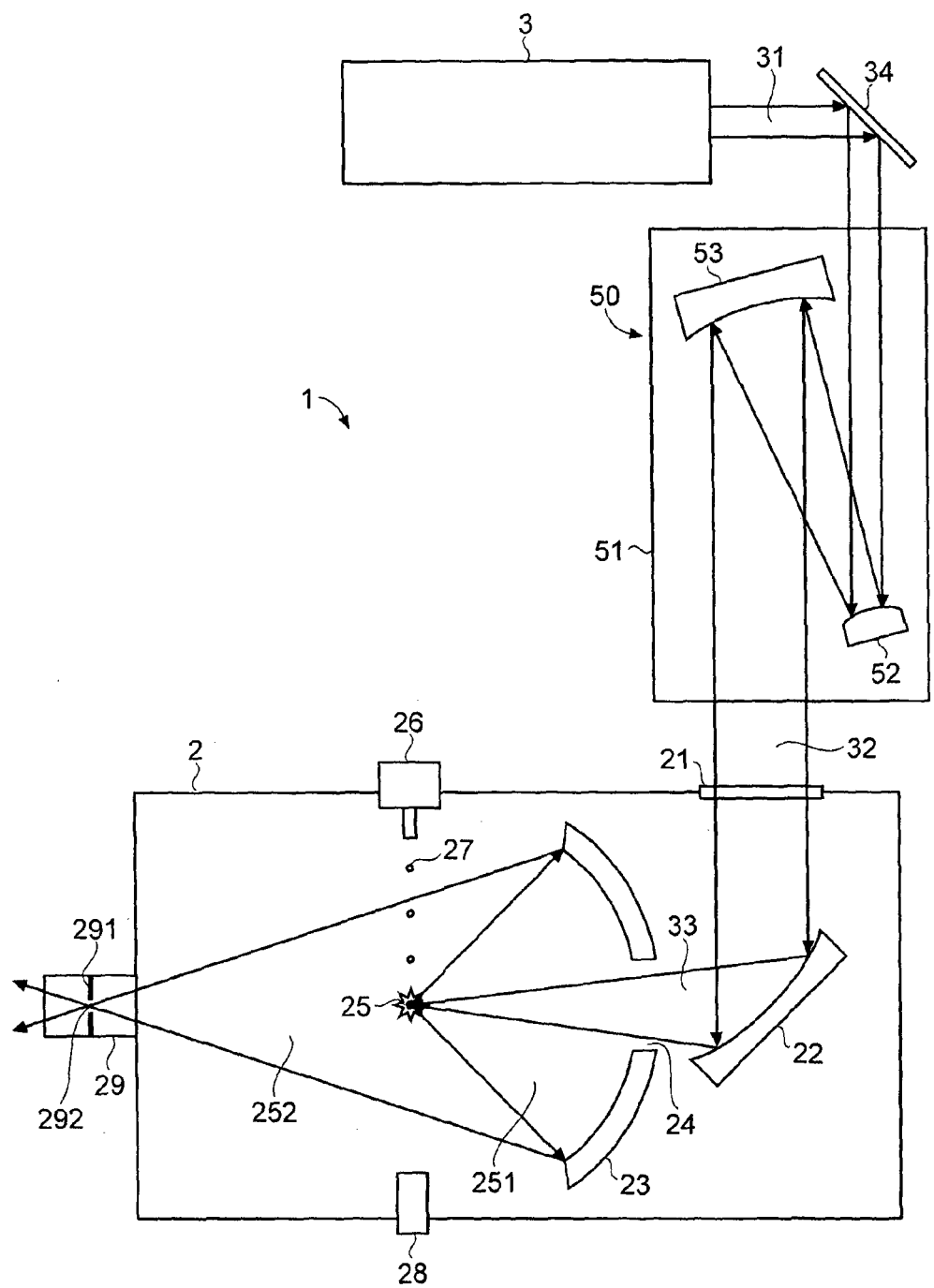
FIG. 2 illustrates an example of an EUV light generation apparatus including a beam expanding optical system and a focusing optical system according to one embodiment of this disclosure.

FIG. 2 illustrates an example of an EUV light generation apparatus including a beam expanding optical system and a focusing optical system. Note that the EUV light generation control unit 5 and the target sensor 4 are omitted in FIG. 2 for the sake of simplifying the description.

In order to focus the pulsed laser beam 33 with a desired spot size in the plasma generation region 25, the pulsed laser beam 33 may need to be focused while ensuring high numerical apertures (NA) by expanding the pulsed laser beam 31 in diameter. Accordingly, as illustrated in FIG. 2, the EUV light generation apparatus 1 may include, for example, a beam expanding optical system 50 and the laser beam focusing mirror 22 serving as the focusing optical system. The beam expanding optical system 50 may include a spherical convex mirror 52 and a spherical concave mirror 53, for example. The convex mirror 52 and the concave mirror 53 may be anchored adjustably to a plate 51.

4.2 Operation

The pulsed laser beam 31 may have the travel direction thereof be adjusted by the laser beam travel direction control actuator 34 and be incident on the beam expanding optical system 50. The laser beam travel direction control actuator 34 may include a high-reflection mirror and an actuator for adjusting the inclination of the reflective surface thereof. In the beam expanding optical system 50, the pulsed laser beam 31 may first be reflected by the convex mirror 52. By being reflected by the convex mirror 52, the pulsed laser beam 31 may be expanded in diameter. Then, the pulsed laser beam 31 may be reflected by the concave mirror 53. By being reflected by the concave mirror 53, the pulsed laser beam 31 may be transformed into a substantially collimated pulsed laser beam 32 and be outputted from the beam expanding optical system 50.

4.3 Problems

In the case where the pulsed laser beam 31 is expanded in diameter, an optical element for propagating the pulsed laser beam 31, which has been expanded in diameter, may need to be increased in size. Further, since the pulsed laser beam, having been expanded in diameter, may be propagated as a collimated laser beam, an optical space downstream from the beam expanding optical system may need to be increased in size as well. However, the chamber 2 may sustain a vacuum; thus, it may be preferable that the chamber 2 is small in volume from the viewpoint of the efficiency of creating and sustaining the vacuum. Accordingly, the beam expanding optical system and the focusing optical system may not be disposed inside the chamber 2 in some cases, and may instead be disposed outside of the chamber 2. For example, as illustrated in FIG. 2, there may be cases where the beam expanding optical system 50 is increased in size and is separated from the focusing optical system (laser beam focusing mirror 22, for example). When the beam expanding optical system and the focusing optical system are separated, the optical alignment thereof may be more likely to be shifted due to vibration, heat, and so forth. As a result, when the pulsed laser beam 31 propagated by such optical system is focused on the target 27, the stability and the controllability of the pulsed laser beam 33 may be deteriorated.

Figure 3:
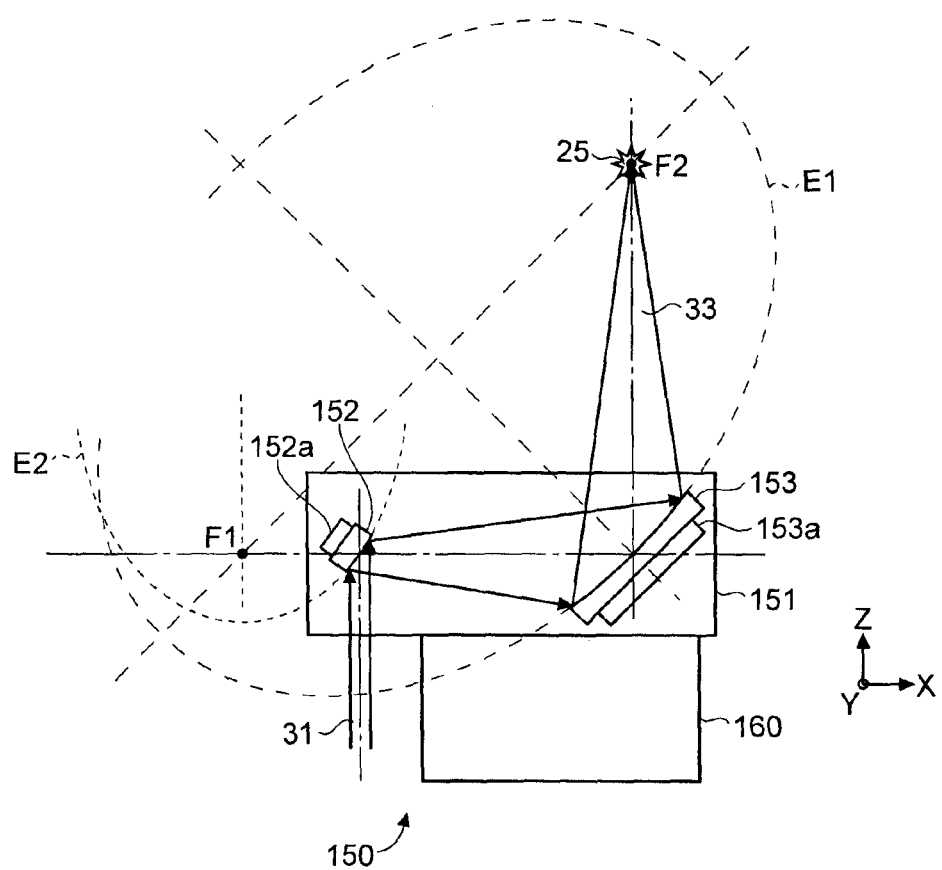
FIG. 3 illustrates an example of a beam expanding focusing optical system according to one embodiment.

5. Embodiment in which a First Mirror for Expanding a Laser Beam and a Second Mirror for Focusing the Laser Beam are Combined Accordingly, the beam expanding optical system and the focusing optical system may be integrated into a single unit. FIG. 3 illustrates an example of a beam expanding focusing optical system 150 according to one embodiment.

5.1. Configuration

As illustrated in FIG. 3, the beam expanding focusing optical system 150 may include an off-axis paraboloidal convex mirror (first mirror) 152 and a spheroidal concave mirror (second mirror) 153. The convex mirror 152 may serve as the beam expanding optical system, for example. The concave mirror 153 may serve as the focusing optical system, for example. The convex mirror 152 and the concave mirror 153 may preferably be disposed such that a focus of a parabola E2 extended from the off-axis paraboloidal surface of the convex mirror 152 coincides with a focus of an ellipse E1 extended from the reflective surface of the concave mirror 153 on a focus F1. Note that the symmetry axis of the parabola E2 and the major axis of the ellipse E1 may preferably intersect with each other at 45 degrees, for example.

The convex mirror 152 may be anchored adjustably to the plate 151 with a mirror holder 152*a*, for example. Similarly, the concave mirror 153 may be anchored adjustably to the plate 151 with a mirror holder 153*a*, for example. Accordingly, the beam expanding optical system and the focusing optical system may be integrated into a single unit. The plate 151 may be anchored to a movable stage 160 (or moving mechanism), for example. The stage 160 may be movable in X-, Y-, and Z-directions (i.e., in three dimensions/directions), for example. Further, the stage 160 may be movable in θx- and θy-directions, as well (e.g., the stage 160 may be rotatable about axes extending in the X- and Y-directions shown in FIG. 3). With this, the beam expanding optical system and the focusing optical system, together with the plate 151, may be moved in the direction of the beam axis of the pulsed laser beam 33 (Z-direction) and in X- and Y-directions, which are orthogonal to each other.

5.2 Operation

The pulsed laser beam 31 may be incident on the convex mirror 152 at 45 degrees (e.g., at an angle of 45 degrees with respect to the principal axis of the mirror 152). The pulsed laser beam 31 reflected by the convex mirror 152 may be expanded in diameter and be incident on the concave mirror 153 at 45 degrees (e.g., at an angle of 45 degrees with respect to the principal axis of the mirror 153), the concave mirror 153 being disposed so as to be inclined by 45 degrees with respect to the convex mirror 152. The pulsed laser beam 31 incident on the convex mirror 153 may be reflected as a converging pulsed laser beam 33. The reflected pulsed laser beam 33 may be focused at the other focus F2 of the spheroidal surface of the concave mirror 153. The focus F2 may be included in the plasma generation region 25.

5.3 Effect

As has been described so far, the beam expanding focusing optical system 150 according to this embodiment may include a small number of optical elements. Thus, a compact beam expanding focusing optical system 150 may be achieved. As a result, the stability and the controllability of a focused laser beam may be improved. Further, adjusting the beam axis of the focusing optical system may be achieved only by aligning the beam axis of the laser beam incident on the focusing optical system; thus, the arrangement and the replacement of the beam expanding focusing optical system 150 may be facilitated.

Figure 4:
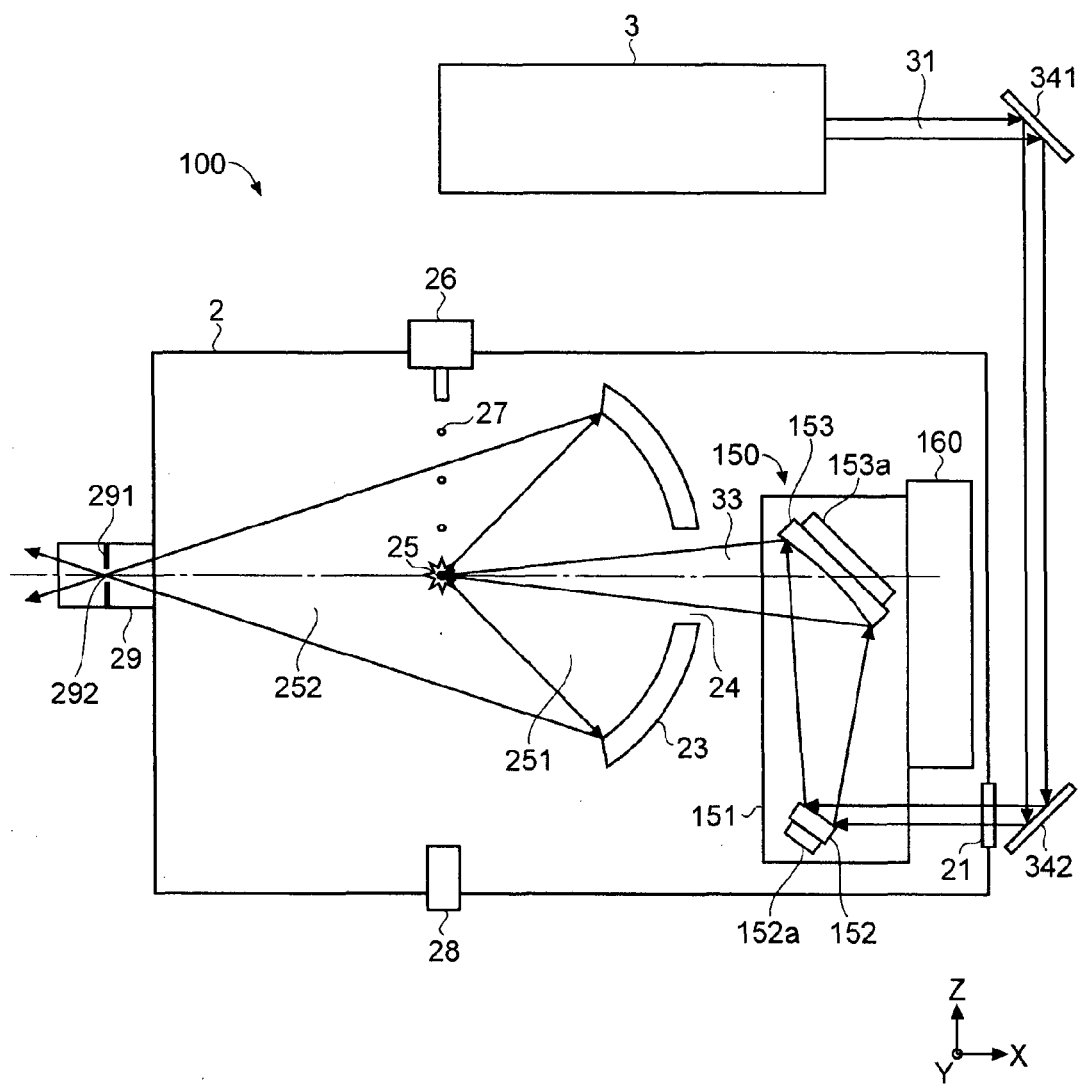
FIG. 4 illustrates an example of an EUV light generation apparatus including the beam expanding focusing optical system according to the embodiment.

6. Embodiment of EUV Light Generation Chamber Including First and Second Mirrors Subsequently, an example in which the beam expanding focusing optical system 150 shown in FIG. 3 is used in an EUV light generation apparatus will be described with reference to the drawings. FIG. 4 illustrates an example of an EUV light generation apparatus 100 including the beam expanding focusing optical system 150. Note that the EUV light generation control unit 5 and the target sensor 4 are omitted in FIG. 4 for the sake of simplifying the description. Further, the laser beam travel direction control actuator 34 may include two high-reflection mirrors 341 and 342. The high-reflection mirrors 341 and 342 may control the direction in which the laser beam incident thereon travels by using actuators (not shown) for adjusting the inclination or orientation of the respective reflective surfaces thereof.

6.1 Configuration

As illustrated in FIG. 4, the beam expanding focusing optical system 150 may be disposed inside the chamber 2. In this case, the concave mirror 153 may serve as the laser beam focusing mirror 22.

6.2 Operation

In the configuration shown in FIG. 4, the pulsed laser beam 31 may be reflected by the high-reflection mirrors 341 and 342 without being expanded in diameter, and enter the chamber 2 via the window 21. The pulsed laser beam 31, having entered the chamber 2, may be incident on the convex mirror 152 at 45 degrees and be reflected thereby, to thereby be expanded in diameter.

Then, the pulsed laser beam 31 may be incident on the concave mirror 153 at 45 degrees and be reflected thereby, to thereby be focused on the target 27 in the plasma generation region 25. Here, moving the stage 160 in X-, Y-, and Z-directions may allow the focus position of the pulsed laser beam 33 to be adjusted, so that the pulsed laser beam 33 may be focused at a desired position.

6.3 Effect

Being configured as such, the beam expanding optical system and the focusing optical system may be disposed inside the chamber 2, whereby the window 21 on which the pulsed laser beam 31 is incident may be made smaller because the beam 31 enters the chamber 2 through the window 21 before having its diameter expanded.

Figure 5:
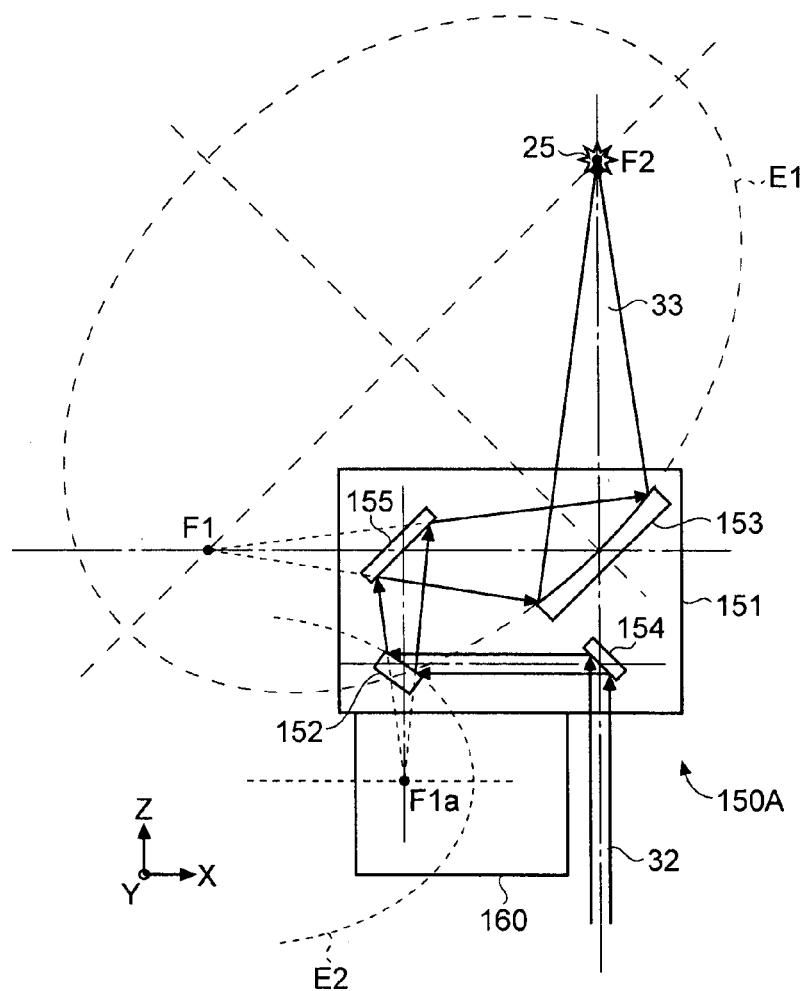
FIG. 5 illustrates an example of a beam expanding focusing optical system according to another embodiment of this disclosure.

7. Optical System for Making Incident Axis and Focusing Axis of Laser Beam Coincide with Each Other A modification of the beam expanding focusing optical system will be described below with reference to the drawings. FIG. 5 illustrates an example of a beam expanding focusing optical system 150A according to another embodiment.

7.1 Configuration

As illustrated in FIG. 5, the beam expanding focusing optical system 150A may include the convex mirror 152 (e.g., a paraboloidal convex mirror), the concave mirror 153 (e.g., a spheroidal concave mirror), and flat high-reflection mirrors 154 and 155. The convex mirror 152 and the concave mirror 153 may be similar in configuration to the convex mirror 152 and the concave mirror 153 according to the above embodiment. The high-reflection mirror 154 may be disposed upstream from the convex mirror 152 on a beam path of the pulsed laser beam 31, or 32 (as shown). The high-reflection mirror 155 may be disposed between the convex mirror 152 and the concave mirror 153 on the beam path of the pulsed laser beam 31/32. The high-reflection mirrors 154 and 155 may be anchored adjustably to the plate 151, in a manner similar to the manner in which the convex mirror 152 and the concave mirror 153 are anchored adjustably to the plate 151.

Here, the mirrors 152-155 may be disposed such that the beam axis of the pulsed laser beam 31/32 incident on the high-reflection mirror 154 substantially coincides with the beam axis of the pulsed laser beam 33 reflected by the concave mirror 153. In addition, the mirrors 152-155 may be disposed such that flat mirror 155 is disposed between a reflective surface of the concave mirror 153 and a first focus F1 of the concave mirror 153 so that a reflective surface of the flat mirror 155 faces the reflective surface of the concave mirror 153, and such that a focus F1a of the convex mirror 152 substantially coincides with a first focus F1 of the concave mirror 153, the first focus F1 being projected by the flat mirror 155.

7.2 Operation

The pulsed laser beam 31/32 may be incident on the high-reflection mirror 154 at 45 degrees and be reflected thereby at 45 degrees (e.g., at a 45 degree angle with respect to a surface of mirror 154, or at a 45 degree angle with respect to a direction normal to a surface of mirror 154). Then, the reflected pulsed laser beam 31/32 may be incident on the convex mirror 152 at 45 degrees. The pulsed laser beam 31/32 incident on the convex mirror 152 may be reflected thereby at 45 degrees, be expanded in diameter, and thereafter be incident on the high-reflection mirror 155 at 45 degrees (e.g., at a 45 degree angle with respect to a surface of mirror 155, or at a 45 degree angle with respect to a direction normal to a surface of mirror 155).

The high-reflection mirror 155 may reflect the pulsed laser beam 31/32 incident thereon at 45 degrees. The pulsed laser beam 31/32 reflected by the high-reflection mirror 155 may be incident on the concave mirror 153 at 45 degrees. Then, the concave mirror 153 may reflect the pulsed laser beam 31/32 at 45 degrees, and the reflected pulsed laser beam 31/32 (reflected as a pulsed laser beam 33) may be focused on the target 27 in the plasma generation region 25.

7.3 Effect

In the above configuration, the high-reflection mirror 154 and the concave mirror 153 may be anchored adjustably to the plate 151 such that the beam axis of the pulsed laser beam 31/32 incident on the high-reflection mirror 154 substantially coincides with the beam axis of the pulsed laser beam 33 reflected by the concave mirror 153. Accordingly, the control for moving the focus of the pulsed laser beam 33 in X-, Y-, and Z-directions may be made in a manner similar to the control in the case where the beam expanding focusing optical system 150A is replaced by lenses. Further, interposing the high-reflection mirror 155 between the convex mirror 152 and the concave mirror 153 may make it possible to bend the beam path of the pulsed laser beam 31/32, whereby the plate 151 may be made smaller. As a result, the beam expanding focusing optical system 150A may be reduced in size.

Figure 6:
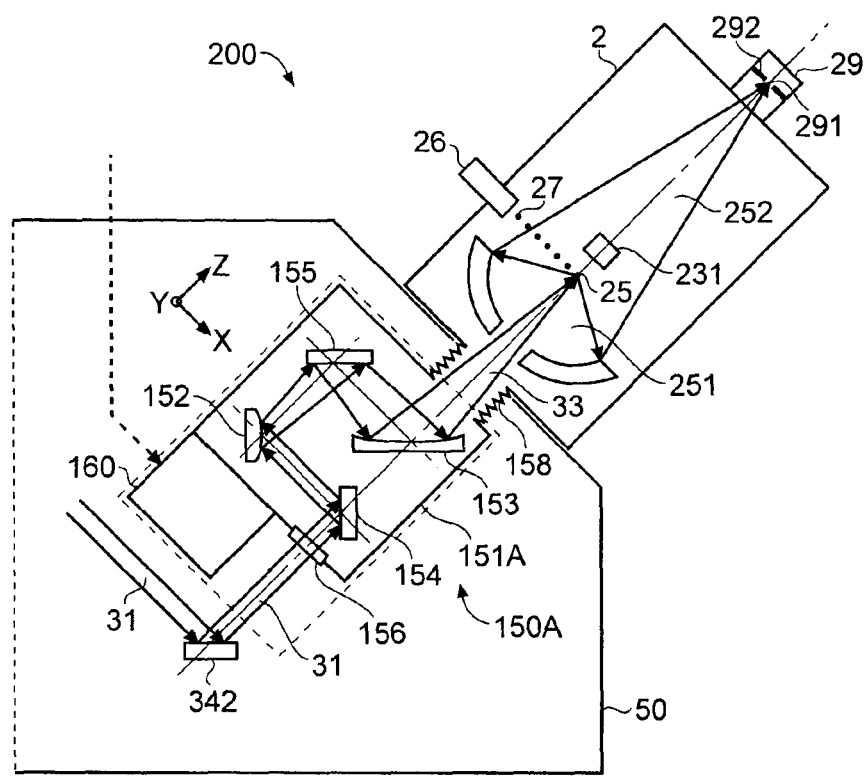
FIG. 6 illustrates an example of an EUV light generation apparatus including the beam expanding focusing optical system shown in FIG. 5.

8. Embodiment of EUV Light Generation Apparatus Including Optical System for Making Incident Axis and Focusing Axis of Laser Beam Coincide with Each Other Subsequently, a case where the beam expanding focusing optical system 150A shown in FIG. 5 is used in an EUV light generation apparatus will be described with reference to the drawings. FIG. 6 illustrates an example of an EUV light generation apparatus 200 including the beam expanding focusing optical system 150A.

8.1 Configuration

As illustrated in FIG. 6, in the EUV light generation apparatus 200 according to this embodiment, the convex mirror 152, the concave mirror 153, and the high-reflection mirrors 154 and 155 may be anchored adjustably to the interior of a box 151A, in place of the plate 151. The box 151A may be connected to the chamber 2 with a sealed flexible pipe 158, and the pulsed laser beam 33 may enter the chamber 2 via the flexible pipe 158. Further, the box 151A may be provided with a window 156, through which the pulsed laser beam 31 enters the box 151A.

The box 151A may be movable in X-, Y-, and Z-directions by the stage 160, in a manner similar as the plate 151 of FIG. 3 has been described as being movable by stage 160. Further, the box 151A may be disposed inside a housing 50 for disposing the chamber 2 so as to be inclined by 45 degrees, for example.

8.2 Operation

In the above configuration, the pulsed laser beam 31 may be reflected by the high-reflection mirror 342 without being expanded in diameter, and enter the box 151A via the window 156. The pulsed laser beam 31 may be reflected by the high-reflection mirror 154, the convex mirror 152, the high-reflection mirror 155, and the concave mirror 153 disposed inside the box 151A. Then, the pulsed laser beam 33 reflected by the concave mirror 153 may be focused on the target 27 in the plasma generation region 25. Here, moving the box 151A in X-, Y-, and Z-directions using the stage 160 may make it possible to adjust the focus position of the pulsed laser beam 33 to a desired position.

8.3 Effect

As has been described so far, the box 151A may be connected airtightly to the chamber 2 through the flexible pipe 158. This may make it possible to move the beam expanding focusing optical system 150A without disposing the stage 160 inside the chamber 2. As a result, the interior of the chamber 2 may be prevented from being contaminated by a contaminating material from the stage 160. Further, the stage 160 need not be treated for vacuum use; thus, the manufacturing cost may be reduced.

9. Combination with Mirror Equipped with Tilt Mechanism

Figure 7:
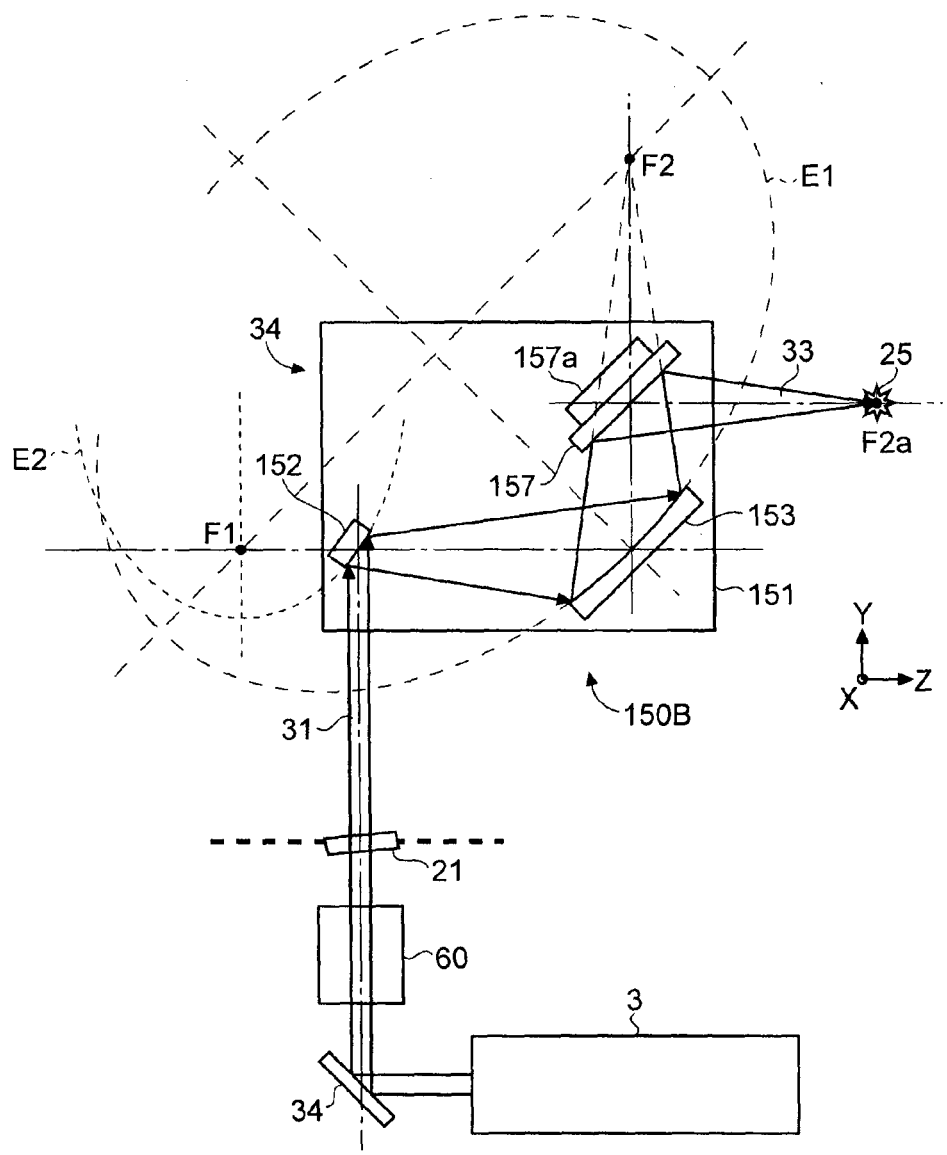
FIG. 7 illustrates an example of a beam expanding focusing optical system according to yet another embodiment of this disclosure.

Another embodiment of the beam expanding focusing optical system will be described below with reference to the drawings. FIG. 7 illustrates an example of a beam expanding focusing optical system 150B according to this embodiment.

9.1 Configuration

As illustrated in FIG. 7, the beam expanding focusing optical system 1502 may include the convex mirror 152, the concave mirror 153, and a flat mirror 157 to which a tilt mechanism 157a is attached. The flat mirror 157 may be positioned between the concave mirror 153 and the focus thereof, such that a reflective surface of the flat mirror 157 faces the reflective surface of the concave mirror 153. The convex mirror 152, the concave mirror 153, and the flat mirror 157 may be anchored adjustably to the plate 151 with respective holders (not shown). The flat mirror 157 may preferably be disposed such that the pulsed laser beam reflected by the concave mirror 153 is incident on the flat mirror 157 at 45 degrees and the incident pulsed laser beam is reflected by the flat mirror 157 at 45 degrees and is focused in a focus F2a. The focus F2a may be included in the plasma generation region 25.

A focus position adjusting mechanism 60 capable of adjusting the focus position of the pulsed laser beam 33 may be disposed between the laser apparatus 3 and the convex mirror 152 on the beam path.

9.2 Operation

In the above configuration, the pulsed laser beam 31 may enter the focus position adjusting mechanism 60 via the laser beam travel direction control actuator 34. The focus position adjusting mechanism 60 may adjust the curvature of the wavefront of the pulsed laser beam 31, in order to adjust the focus position of the pulsed laser beam 33 in X-direction in the plasma generation region 25, for example. The pulsed laser beam 31, of which the curvature of the wavefront has been adjusted, may enter the chamber 2 via the window 21.

Thereafter, the pulsed laser beam 31 may be incident on the flat mirror 157 via the convex mirror 152 and the concave mirror 153. The flat mirror 157 may have the inclination of the reflective surface thereof be controlled by the tilt mechanism 157a capable of adjusting the inclination or orientation of the reflective surface of the flat mirror 157 in an angle θx in X-direction and an angle θy in Y-direction.

9.3 Effect

As has been described so far, providing the flat mirror 157 with the tilt mechanism 157a may make it possible to move the focus F2a of the flat mirror 157 in X-direction and in Y-direction. As a result, the stage 160 may be omitted; thus, the beam expanding focusing optical system 150B may further be reduced in size. Further, the plate 151 to which the optical elements in the beam expanding focusing optical system 150B are anchored may be fixed to the chamber 2. As a result, the beam axis of the pulsed laser beam 33 may be stabilized.

10. Supplementary Description 10.1 Tilt Mechanism

Figure 8:
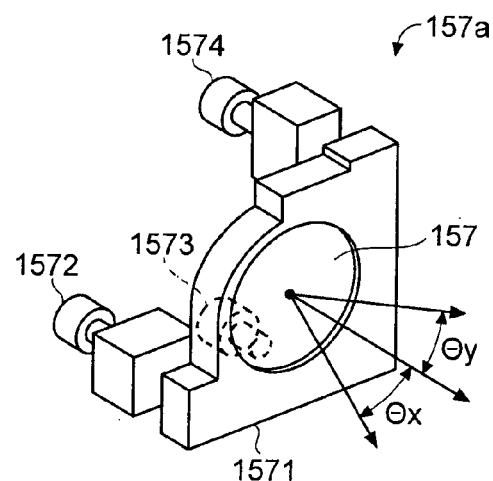
FIG. 8 is a perspective view illustrating an example of a tilt mechanism according to one embodiment of this disclosure.

Here, an example of the tilt mechanism 157a in the beam expanding focusing optical system 150B shown in FIG. 7 will be described with reference to the drawings. FIG. 8 is a perspective view illustrating an example of the tilt mechanism 157a. As illustrated in FIG. 8, the tilt mechanism 157a may include a holder 1571 to which the flat mirror 157 is anchored and automatic micrometers 1572 through 1574, for example. Mounting the holder 1571 to the plate 151 via the automatic micrometers 1572 through 1573 may make it possible to adjust the angle θx in X-direction and the angle θy in Y-direction of the flat mirror 157 anchored to the holder 1571.

10.2 Focus Position Adjusting Mechanism

Figure 9:
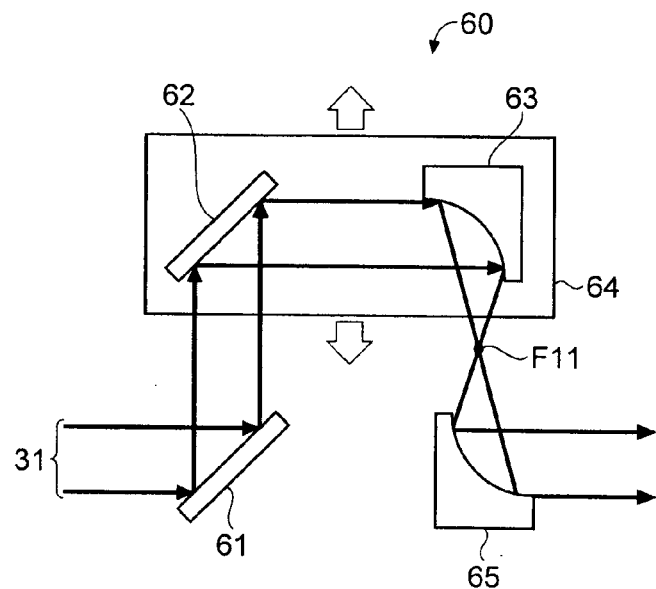
FIG. 9 illustrates an example of a focus position adjusting mechanism shown in FIG. 7.

An example of the focus position adjusting mechanism 60 shown in FIG. 7 will be described below with reference to the drawings. FIG. 9 illustrates an example of the focus position adjusting mechanism 60. As illustrated in FIG. 9, the focus position adjusting mechanism 60 may include high-reflection mirrors 61 and 62 and off-axis paraboloidal concave mirrors 63 and 65. The high-reflection mirror 62 and the off-axis paraboloidal concave mirror 63 may be anchored to a stage 64, which is movable with respect to the high-reflection mirror 61 and the off-axis paraboloidal concave mirror 65. Moving the stage 64 to adjust the distance between the off-axis paraboloidal concave mirrors 63 and 65 may make it possible to adjust the wavefront of the incident pulsed laser beam 31 to a predetermined wavefront.

10.3 Modification of Focus Position Adjusting Mechanism

Figure 10:
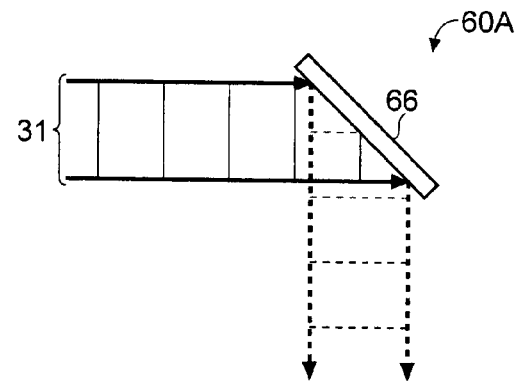
FIG. 10 illustrates a modification of the focus position adjusting mechanism shown in FIG. 7.
Figure 11:
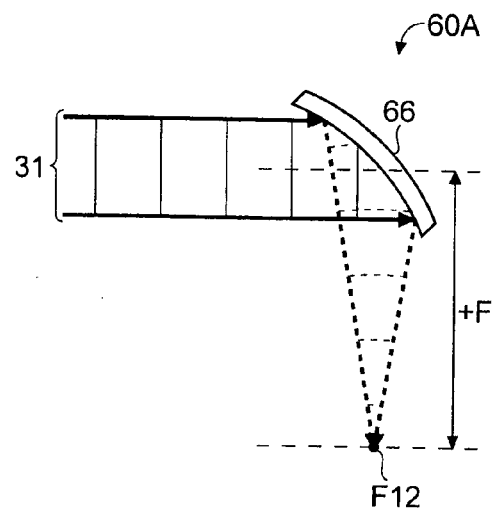
FIG. 11 illustrates a modification of the focus position adjusting mechanism shown in FIG. 7.
Figure 12:
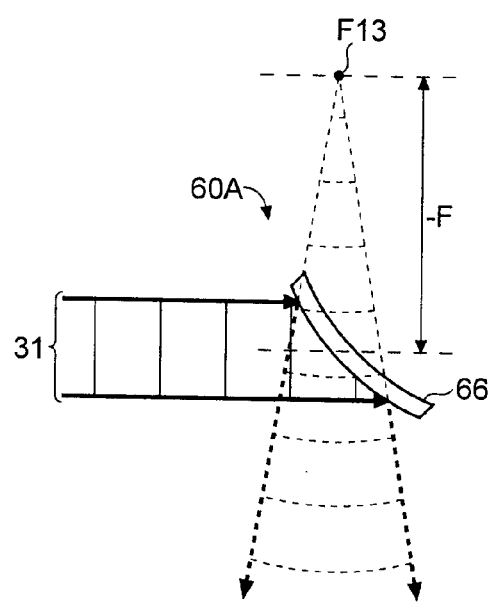
FIG. 12 illustrates a modification of the focus position adjusting mechanism shown in FIG. 7.

Further, the focus position adjusting mechanism 60 shown in FIG. 7 may be modified as shown in FIGS. 10 through 12. FIGS. 10 through 12 illustrate an example of a focus position adjusting mechanism 60A according to a modification. As illustrated in FIGS. 10 through 12, the focus position adjusting mechanism 60A may include a deformable mirror 66, of which the curvature of the reflective surface can be modified. The deformable mirror 66 may reflect the collimated pulsed laser beam 31 incident thereon as a collimated laser beam, when the reflective surface thereof is adjusted to be flat, as illustrated in FIG. 10. The deformable mirror 66, when the curvature of the reflective surface thereof is adjusted to be concave, may reflect the collimated pulsed laser beam 31 incident thereof such that the pulsed laser beam 31 is focused at a predetermined focus F12 distanced therefrom by a focal distance +F, as illustrated in FIG. 11. Alternatively, the deformable mirror 66, when the curvature of the reflective surface thereof is adjusted to be convex, may reflect the collimated pulsed laser beam 31 incident thereon as a convex beam such that the pulsed laser beam 31 may be focused at a virtual focus F13 distanced therefrom by a focal distance –F, as illustrated in FIG. 12. As has been described so far, using the deformable mirror 66, of which the curvature of the reflective surface may be modified, may make it possible to adjust the wave front of the reflected laser beam to a predetermined wavefront in accordance with the wavefront of the incident laser beam.

The above-described embodiments and the modifications thereof are merely examples for implementing this disclosure, and this disclosure is not limited thereto. Making various modifications according to the specifications or the like is within the scope of this disclosure, and it is apparent from the above description that other various embodiments are possible within the scope of this disclosure. For example, the modifications illustrated for particular ones of the embodiments can be applied to other embodiments as well (including the other embodiments described herein).

The terms used in this specification and the appended claims should be interpreted as "non-limiting." For example, the terms "include" and "be included" should be interpreted as "including the stated elements but not being limited to the stated elements." The term "have" should be interpreted as "including the stated elements but not being limited to the stated elements." Further, the modifier "one (a/an)" should be interpreted as "at least one" or "one or more."

What is claimed is:

1. An extreme ultraviolet light generation apparatus for generating plasma by irradiating a target material with a laser beam and outputting extreme ultraviolet light radiated from the plasma, the apparatus comprising:

a box including at least one window through which a laser beam outputted from a laser apparatus is introduced into the box;

a chamber connected to the box via a flexible pipe, the laser beam being introduced into the chamber through the flexible pipe from the box;

a beam expanding optical system disposed inside the box for expanding the laser beam in diameter;

a focusing optical system disposed inside the box for focusing the laser beam expanded in diameter on a plasma generation region in the chamber; and a stage disposed outside the chamber and the box and configured to move the box with respect to the chamber.

2. The extreme ultraviolet light generation apparatus according to claim 1, further comprising a focus position adjusting mechanism disposed between the laser apparatus and the at least one window.

3. An extreme ultraviolet light generation apparatus for generating plasma by irradiating a target material with a laser beam at a plasma generation region and outputting extreme ultraviolet light radiated from the plasma, the apparatus comprising:

a chamber including at least one window through which a laser beam outputted from a laser apparatus is introduced into the chamber;

an EUV collector mirror disposed inside the chamber, the EUV collector mirror being configured to collect the extreme ultraviolet light radiated from the plasma;

a beam expanding optical system disposed inside the chamber for expanding the laser beam in diameter, the beam expanding optical system including an off-axis paraboloidal convex mirror;

a focusing optical system disposed inside the chamber for focusing the laser beam expanded in diameter on the plasma generation region, the focusing optical system including a spheroidal concave mirror; and a stage disposed inside the chamber configured to move the beam expanding optical system and the a focusing optical system, wherein the beam expanding optical system and the focusing optical system are disposed such that a focus of the convex mirror substantially coincides with a first focus of the concave mirror, and wherein only the EUV collector mirror is disposed between the plasma generation region and the beam expanding optical system.

4. The extreme ultraviolet light generation apparatus according to claim 3, further comprising a focus position adjusting mechanism disposed between the laser apparatus and the at least one window.

* * * * *